United States Patent [19]

Groves et al.

[11] Patent Number: 4,859,856

[45] Date of Patent: Aug. 22, 1989

[54] TELECENTRIC SUB-FIELD DEFLECTION WITH VAIL

[75] Inventors: Timothy R. Groves, Poughkeepsie, N.Y.; Hans C. Pfeiffer; Werner Stickel, both of Ridgefield, Conn.; Maris A. Sturans, Poughquag, N.Y.

[73] Assignee: International Business Machines Corporation, Armonk, N.Y.

[21] Appl. No.: 142,035

[22] Filed: Jan. 11, 1988

[51] Int. Cl.$^4$ .............................................. H01J 37/20
[52] U.S. Cl. ............................. 250/398; 250/396 ML
[58] Field of Search ........... 250/396 R, 396 ML, 398; 219/121 ES, 121 EW

[56] References Cited

U.S. PATENT DOCUMENTS 4,140,913 2/1979 Anger et al. ........................ 250/398
4,544,846 10/1985 Langer et al. ................ 250/396 ML Primary Examiner—Bruce C. Anderson
Attorney, Agent, or Firm—Graham S. Jones, II

[57] ABSTRACT

A two staqge, electron beam projection system includes a target, a source of an electron beam and means for projecting an electron beam towards the target with its upper surface defining a target plane. A magnetic projection lens has a principal plane and a back focal plane located between said means for projecting and the target. The means for projecting provides an electron beam directed towards the target. First stage means provides deflection of the beam from area to area within a field. Second stage means provides for deflection of the beam for providing deflection of the beam within an area within a field. The beam crossing the back focal plane produces a telecentric condition of the beam in the image plane with the beam substantially normal to the target plane from the principal plane to the target plane. The magnetic projection lens includes a magnetic structure providing for magnetic compensation positioned within the bore of the projection lens, which produces a compensating magnetic field substantially proportional to the first derivative of the axial magnetic projection field. The axial magnetic projection field provides substantially a zero first derivative of the axial magnetic projection field in the vicinity of the target. The projection system projects on the target plane from the projection system as deflected by the upper and lower stages, at all times maintaining the telecentric condition of the electron beam at the target plane throughout the entire range of deflection of the beam, assuring minimum errors due to target height variations.

7 Claims, 3 Drawing Sheets

TELECENTRIC SUB-FIELD DEFLECTION WITH VAIL

BACKGROUND OF THE INVENTION

The present invention relates to scanning an electron beam in a predetermined pattern over a surface, and more particularly to a multi-stage deflection system with means for shifting the axis of the beam, where the beam is telecentric with respect to the target of the beam.

DESCRIPTION OF RELATED ART

A significant problem with electron beam systems of exposure is that many conflicting objectives must be satisfied. The need for speed of scanning and large scale fields of exposure must be reconciled with accuracy of the positioning of the beam. Multiple stage deflection makes it possible to scan a larger area with the electron beam. Variable Axis Immersion Lens (VAIL) systems and the equivalent of VAIL systems make it possible to eliminate eddy currents and stray magnetic fields in the target area. Thus to achieve a satisfactory design for an electron beam exposure system, a number of problems must be juggled within the constraints caused by several electromagnetic factors. A key object of this invention is to combine the above advantageous features into a single system, while minimizing the conflicts between the differing requirements of the systems.

Referring to specific prior art, the problem of beams being normal to the wafer in an E-beam exposure system for chips is dealt with by Herriott and Brewer in "Electron-Beam Lithography Machines" in Electron-Beam Technology in Microelectronic Fabrication, Edited by George R. Brewer, Academic Press, pp. 182–186 (1980) where it is stated on pages 184–185, as follows:

"An alternative stage-and-exposure strategy has been developed for use on the EBES mask exposure system (Herriott et al., 1975; Alles et al., 1975). In this approach, a small electron-beam field is scanned to write a pattern on a stripe of a continuously moving substrate. . . . Because the electron-beam deflection angle and the field is very small, the resolution, distortion, and stability of the electron beam in this approach are not seriously limited by aberrations, machine fabrication defects, or mechanical stabilities, and deflection signals are not significantly affected by D/A linearity, amplifier drifts, or power supply stabilities."

"The error in beam position caused by out-of-plane wafer distortion is eliminated by the use of a telecentric electron beam deflection system. A telecentric deflection system is one in which the electron beam remains normal to the substrate for any position in the deflection field (Alles et al., 1975). Telecentricity is more easily achieved for small deflection fields than for large fields. In one approach, a doubly deflected beam crosses the axis of the final lens at the front focus of the lens. The beam is both imaged to a focus and bent by the lens so that it is normal to the substrate. . . . With this double deflection technique, an error in the substrate height does not cause a shift of lateral beam location on the substrate. Furthermore, the depth of focus of the electron beam is normally greater than 10 μm so that adequate focus can be maintained with normal substrate flatness and height control to achieve satisfactory resolution. Laser interferometers, together with small field telecentric lenses, can be used for accurate positional control in the presence of reasonable substrate quality."

Reviewing Herriott and Brewer, cited above, all that is shown is a set of pairs of electrostatic deflection plates in one deflection stage, with no suggestion of a magnetic deflection stage shown or suggested to be included closer to the target.

The Alles et al reference is Alles et al, Supplement to International Electron Devices Meeting (IEEE, New York, 1975) p. 1. The Herriott et al reference is Herriott et al, IEEE Trans. Electron Devices ED-22, pp. 385–392 (1975). Nothing in the Herriott et al article suggests that the axis of the beam could be shifted in conjunction with applicants' teachings of how to employ the double deflection method of achieving a two stage telecentric deflection system.

Japanese Pat. No. J60-225344, JP60-225344, describes use of a stigmatic correction lens or an astigmatic correction lens at the position of a deflector or in the magnetic field of an objective lens above it. This reference does not employ electrostatic deflection and has no variable axis immersion lens. It has but a single deflection coil and it is not telecentric in the image plane.

U.S. Pat. No. 4,199,689 of Takigawa, for "Electron Beam Exposing Method and Electron Beam Apparatus" shows a pair of sets of electrostatic deflection plates in an E-beam system. However the sets of deflection plates comprise only a single stage of deflection. Then the beam passes through an electromagnetic telecentric type objective lens. It states at Col. 2, line 66 as follows:

"The objective lens . . . causes the electron beam to be directed, while being focussed, onto the surface portion of the mask such that it can be incident in a direction substantially vertical to the surface of the mask . . ."

No suggestion is made of compensation of the magnetic field as in the VAIL system which is discussed below, or provision of plural stages of deflection to enhance performance.

U.S. Pat. No. 4,376,249 of Pfeiffer et al entitled "Variable Axis Electron Beam Projection System" describes a projection lens 33 arranged so that upon pre-deflection of the electron beam 39 by deflection yokes 43 and 45, the electron optical axis of the lens shifts to be coincident with the deflected beam. The E-beam is deflected and a magnetic projection lens 33 which has rotational symmetry focuses the deflected beam 39. A pair of correction yokes 55, 57 positioned within the bore of projection lens 33 produce a magnetic compensation field proportional to the first derivative of the axial magnetic field strength distribution curve of projection lens 33 to shift the electron optical axis of projection lens 33 so that the axis of electron beam 39 remains coincident with the shifted electron optical axis and so beam 39 lands perpendicular to target 59.

VAIL System

U.S. Pat. No. 4,544,846 of Langner et al for "Variable Axis Immersion Lens Electron Beam Projection System", known as VAIL, is an improvement on U.S. Pat. No. 4,376,249 above. It also shifts electron beam 39 as in Pfeiffer et al, while eliminating rapidly changing fields, eddy currents and stray magnetic fields in the target area. In Langner et al, however, the variable-axis immersion lens or VAIL structure 12 includes an upper pole piece 13 with a non-zero bore section, a zero bore lower pole piece section 14, and an opening between section 14 and section 19 of upper pole piece 13 for inserting a target into the lens 12. Also, the magnetic compensation yoke 11 is positioned within the bore of the upper pole piece 13 to produce a magnetic compensation field which is proportional to the first derivative of the axial magnetic projection field.

In order to maintain normal landing (telecentricity) for electrostatic sub-field deflection, the system must provide for beam B to cross a plane containing at any given time a rocking point which must be positioned to be located in the Back Focal Plane BFP of the VAIL lens assembly, as described in greater detail below with reference to FIG. 2. The BFP is comprised of the various back focal points on the object side of the projection lens which are all located in the same plane, i.e. the back focal plane BFP. Since the rocking point at the BFP is shifting laterally with the optical axis of a VAIL system, or any other equivalent off axis deflection system employed in accordance with this invention, it is not directly accessible to the electrostatic deflection elements. This is so because the electrostatic deflection elements cannot be placed within the main deflection yoke openings, since the beam B is scanned too far off from the geometrical center GA and produces severe deflection aberrations. However, double electrostatic deflection stages (which are placed before the magnetic yokes of the variable axis deflection lens system in accordance with this invention as shown in FIG. 1) can rock the beam B at the back focal plane BFP maintaining the beam telecentric, so it lands on the workpiece or target T at a normal, i.e. vertical angle.

Pfeiffer and Sturans "Electron Beam Deflection without Off-Axis Aberrations", Electron Optical-Systems, pp 109–114 shows the VAIL system arranged to provide telecentricity of the beam entering the projection lens. There is a showing of only a single stage of magnetic predeflection yokes, without an upper stage of deflection yokes. No suggestion is made as to how or where any such second stage might be placed in this structure.

Two Stage Deflection of an Electron Beam

U.S. Pat. No. 4,140,913 of Anger et al "Charged-Particle Beam Optical Apparatus for the Reduction Imaging of a Mask on a Specimen" shows in FIG. 1, a deflection system with a set of two orthogonal pairs of electromagnetic coils 13 which can also be two pairs of electrostatic deflection plates. Col. 4, lines 40–44. In addition, a second magnetic deflection system 16 is located closer to the target at the common focal plane of a pair of lenses, just before the target. It is stated that the ray path of the projection lens system is telecentric. The problem with this arrangement is that it is not possible to place the deflection inside of the projection lens system as would be required to use the Anger teachings in combination with a VAIL type of deflection system.

U.S. Pat. No. 3,900,736 of Michail et al for "Method and Apparatus for Positioning a Beam of Charged Particles" shows in FIG. 1 an electron beam having two stages of deflection with the upper stage, closer to the electron gun being a set of four magnetic deflection coils 23, 24, 25, and 26 which "control the deflection of the beam 11" in the X and Y directions. Then the beam passes between a pair of sets of electrostatic deflection plates which are closer to the target of the electron beam, followed later on by another pairs of sets of electrostatic deflection plates even closer to the target.

U.S. Pat. No. 4,494,004 of Mauer, Michail and Woodard for "Electron Beam System" shows in FIG. 3 an electron beam column with a projection lens 42 which states at Col. 7, line 7 as follows:

"The remaining portion of the column 30 is the projection lens 42 which includes the dual deflection as part of the column 30. Deflection yokes 43 are current driven by the magnetic deflection circuits to permit, in the present instance, bidirectional raster scanning from subfield to subfield. Within the subfield, electric deflection plates 44 produce vector scanning, rectangle to rectangle, to write the pattern on the target plane 32 . . . "

This system is not telecentric. Note that the electrostatic deflection plates are located inside the projection lens which is not possible with the VAIL configuration.

SUMMARY OF THE INVENTION

The basic function of a system in accordance with this invention is to position an electron beam within an area on the substrate writing surface, while maintaining optimal focus at all positions. In addition to this basic function, there are three additional requirements imposed by the application, namely, electron beam lithography. These requirements are as follows:

1. The total time required to write the pattern shall be as short as possible. This time includes the writing time, during which the beam is stationary, and the deflection time, during which the beam is moving to a fresh writing position.

2. The system shall accommodate a substrate which, though nominally flat, may not be perfectly flat, and still maintain perfect positioning of the beam relative to the substrate. Another way of saying this is that the written pattern shall have no in-plane distortion resulting from non-flatness of the substrate.

3. The resolution of the system shall be as high as possible. The resolution is defined as the dimension of the deflection area divided by the edge acuity of the beam spot. The resolution, defined this way, is equivalent to the number of scan lines across the deflection field area.

It is the manner in which these requirements are fulfilled which constitutes the improvement of this invention over prior art. The general method of meeting each of these requirements will now be discussed in order.

The deflection time, during which the beam is being repositioned, is unproductive, since no writing is taking place. It is, therefore, desirable to make this as short as possible. There are two possible ways to deflect an electron beam: using an electrostatic field or using a magnetic field. An electrostatic field can be made to settle more quickly to a new value, and is therefore employed for its speed. Electrostatic fields suffer from high aberration, however. This means that the beam spot blurs strongly with deflection. A magnetic field, on the other hand, is slow to settle to a new value, but has low aberration.

It follows that the best was to deflect a beam both quickly and over a large area, is to use a two-fold deflection hierarchy. An electrostatic field is employed to deflect quickly over a small subfield, typically 25 to 100 microns in size. Simultaneously, a magnetic field is used to deflect relatively slowly over a larger area, typically 2 to 10 mm in size.

In this way the number of times which the magnetic field must be changed is kept relatively small. The total deflection time is minimized, while maintaining the ability to deflect over a relatively large area.

The simplest deflector consists of a single electrostatic or magnetic element. This causes the beam to change direction. Assuming the substrate is located some distance away from the deflector, the beam is made to move relative to the substrate. For various amounts of deflection, the beam path describes a cone of rays, with the apex or pivot located in the midplane of the deflector. It is easy to see that the slope of the beam path relative to the substrate varies with position. This simple scheme suffers from the drawback that the position of the beam relative to the substrate now depends on the local height of the substrate relative to the deflector. If the substrate is not perfectly flat, a beam placement error results, leading to distortion of the written pattern.

This dependence of position on height is eliminated if we arrange to have the beam impact the substrate at normal incidence everywhere within the deflection area. In this case local height variations of the substrate do not affect the position. Such a deflection scheme is called telecentric. Both the electrostatic and the magnetic deflection must be telecentric, in order that the beam position be truly insensitive to substrate height variations.

If we were to place the electrostatic deflector in the front focal plane of the projection lens, this would result in telecentric deflection. This is seen by considering the fact that a cone of rays emanating from the front focal point emerge from the lens, by virtue of the fundamental nature of a lens, travelling parallel with the optic axis of the lens. This is normally perpendicular with the substrate.

Unfortunately, this desirable situation cannot be realized in practice, since there is insufficient room to place the electrostatic deflector in the focal plane of the lens.

It is possible, however, to accomplish the same thing using two electrostatic deflectors, physically separated from each other and from the focal plane of the lens. By exciting the two deflectors synchronously, and with a constant proportionality of drive voltages, the beam is made to pivot about a single point. The location of this pivot point is determined by the proportionality constant. It follows that a unique value of proportionality exists for which the beam pivots about the front focal point of the projection lens. This solves the problem by allowing telecentric deflection with deflectors which are physically remote from the focal plane.

This represents a key feature of this invention. It is far from trivial to achieve telecentricity while satisfying the three special requirements mentioned above. A very important aspect of this invention is the totality of satisfying all of the requirements simultaneously. This is an important distinction of this invention from the prior art.

The magnetic main field deflection is telecentric as well. This is achieved as follows: two magnetic deflectors are employed. The first bends the beam away from the optical axis of the system, while the second restores the beam parallel with the optical axis. The projection lens, by virtue of its fundamental lens property, would tend to deflect the beam back toward the optical axis. This is counteracted by the VAIL correction yoke, which maintains the beam undeflected through the projection lens. Since the tendency of the lens to deflect the beam increases with the distance of the beam from the optic axis, it follows that the VAIL correction yoke must be excited by an amount proportional to the distance of the beam from the axis. It is, therefore, driven synchronously with the magnetic deflection yoke above.

The transverse magnetic field of the VAIL yoke is, furthermore, maintained proportional to the first axial derivative of the axial component of the magnetic field of the projection lens. By virtue of the fundamental equivalent to laterally shifting the magnetic axis of symmetry of the projection lens, so that this magnetic axis always coincides with the beam path.

There are two beneficial consequences of this. The first is that the projection lens does not deflect the beam, and does not disturb the telecentric condition. The second is that no additional aberration is introduced by the deflection, causing no additional blurring of the beam spot. Both of these consequences result from the fact that the beam path coincides with the lens axis at all times, regardless of the magnetic amount of magnetic deflection.

As mentioned, the resolution of the system is the field size divided by the beam edge acuity. The low aberration or blurring of the present system is, therefore, a necessary condition for achieving high resolution. This system is capable of deflecting over a 10 mm field, while maintaining an edge acuity of 0.1 micron. This is equivalent to 100,000 lines of resolution. By comparison, commercial television has about 500 resolution lines, and a good electron microscope has about 1000 lines.

The quality of this system is greater than an electron microscope by a factor of 100.

In accordance with this invention a two stage, electron beam projection system includes
(a) a target,
(b) a source of an electron beam and means for projecting the electron beam towards the target with the upper surface thereof defining a target plane,
(c) a magnetic projection lens having a principal plane and a back focal plane located between the means for projecting and the target,
(d) the means for projecting provides electron beam directed towards the target,
(e) lower stage means for provides deflection of the beam from area to area within a field,
(f) upper stage means for provides deflection of the beam within a the area within a field,
(g) the beam crosses the back focal plane producing a telecentric condition of the beam in the image plane with the beam substantially normal to the target plane from the principal plane to the target plane,
(h) the magnetic projection lens includes a magnetic compensation structure positioned within the projection lens,
whereby the projection system projects on the target plane from the projection system as deflected by the upper and lower stages, at all times maintaining the telecentric condition at the target plane throughout the entire range of deflection of the beam, assuring minimum errors due to target height variations.

Preferably the magnetic compensation structure is substantially proportional to the first derivative of the axial magnetic projection field, with the axial magnetic projection field providing substantially a zero first derivative of the axial magnetic projection field in the vicinity of the target.

It is further preferred that the magnetic compensation structure includes a magnetic compensation yoke providing a field compensating for the radial component of the magnetic field of the projection lens. A two stage, electron beam projection system includes
(a) a source of an electron beam and means for projecting the electron beam towards support means for holding a target with the upper surface thereof defining a target plane,
(b) a magnetic projection lens having a principal plane and a back focal plane,
(c) a plurality of magnetic beam shifting means for shifting the axis of the beam and the axis of the projection lens in synchronism,
(d) lower stage means for providing deflection of the beam within a field, the lower stage means including first and second sets of deflection means,
(e) the first set of deflection means deflecting the beam once in a first direction away from the geometrical axis of the system, the second set of deflection means then deflecting the beam back into a path towards the geometrical axis of the system,
(f) upper stage means for providing deflection of the beam comprising third and fourth sets of deflection means for providing deflection of the beam to areas within the field, the upper stage means being located above the lower stage deflection means,
(g) the third and fourth sets of deflection means being directed in the x and y directions of deflection for deflecting the beam once with the third set of deflection means, the fourth set of deflection means then deflecting the beam back into a path through a rocking point in the back focal plane and normal to the back focal plane of the projection lens,
(h) the magnetic projection lens including a magnetic compensation structure positioned within the bore of the projection lens which is substantially proportional to the first derivative of the axial magnetic projection field, with the axial magnetic projection field providing substantially a zero first derivative of the magnetic projection field in the vicinity of the target,
whereby the beam crosses the back focal plane of the projection lens producing a telecentric condition in the image plane with the beam substantially normal to the target plane from the principal plane to the target plane, whereby the projection system projects the spot on the target plane from the projection system as deflected by the upper and lower stages, at all times maintaining the telecentric condition at the target plane throughout the entire range of axis movement assuring minimum errors due to target height variations.

A two stage, electron beam projection system includes
(a) a source of an electron beam and means for projecting the electron beam,
(b) a magnetic projection lens having a principal plane and a back focal plane,
(c) a plurality of magnetic beam shifting means for shifting the axis of the beam and the axis of the projection lens in synchronism,
(c) a collimating lens,
(d) a target plane,
(e) the electron beam being providing a spot directed at the target plane,
(f) the projection system including means for scanning a field to be exposed by the beam,
(g) lower stage means for providing deflection of the beam over a field in a discontinuous row-by-row scan of the field,
(h) upper stage means for providing deflection of the beam comprising first and second sets of electrostatic deflection plates for providing vector deflection of the beam to a series of particular loci upon a target, the upper stage means being located above the lower stage deflection means,
(i) the first and second sets of plates being directed in the x and y directions of deflection for deflecting the beam once with the first set of plates and the second set of plates then deflecting the beam back into a path intersecting the geometrical axis of the beam at a rocking point in the back focal plane of the final projection lens in the absence of a deflection by the lower stage means,
(k) the beam crossing the electron optical axis at the back focal plane of the final projection lens producing a telecentric condition in the image plane with the beam substantially normal to the target plane, whereby the projection system projects the spot on the target plane from the projection system as deflected by the upper and lower stages, at all times maintaining the telecentric condition at the target plane throughout the entire range of axis movement assuring minimum errors due to target height variations.

Preferably the lower stage deflection system comprises a magnetic deflection system for scanning the beam in a modified raster scan extending over a field on the target plane, with the modified raster scan proceeding from the center of one sub-field position to the next sub-field position, one-by-one, with the beam temporarily arresting its scan as it reaches the center of each current sub-field it reaches in the field to permit completion of operations of the electrostatic deflection system.

Preferably, the upper stage deflection system is proximate to the collimating lens.

The foregoing and other objects, features and advantages of the invention will be apparent from the more particular description of the preferred embodiments of the invention which follows.

DESCRIPTION OF THE PREFERRED EMBODIMENT BEST MODE AND OTHER MODES OF CARRYING OUT THE INVENTION

Figure 1:
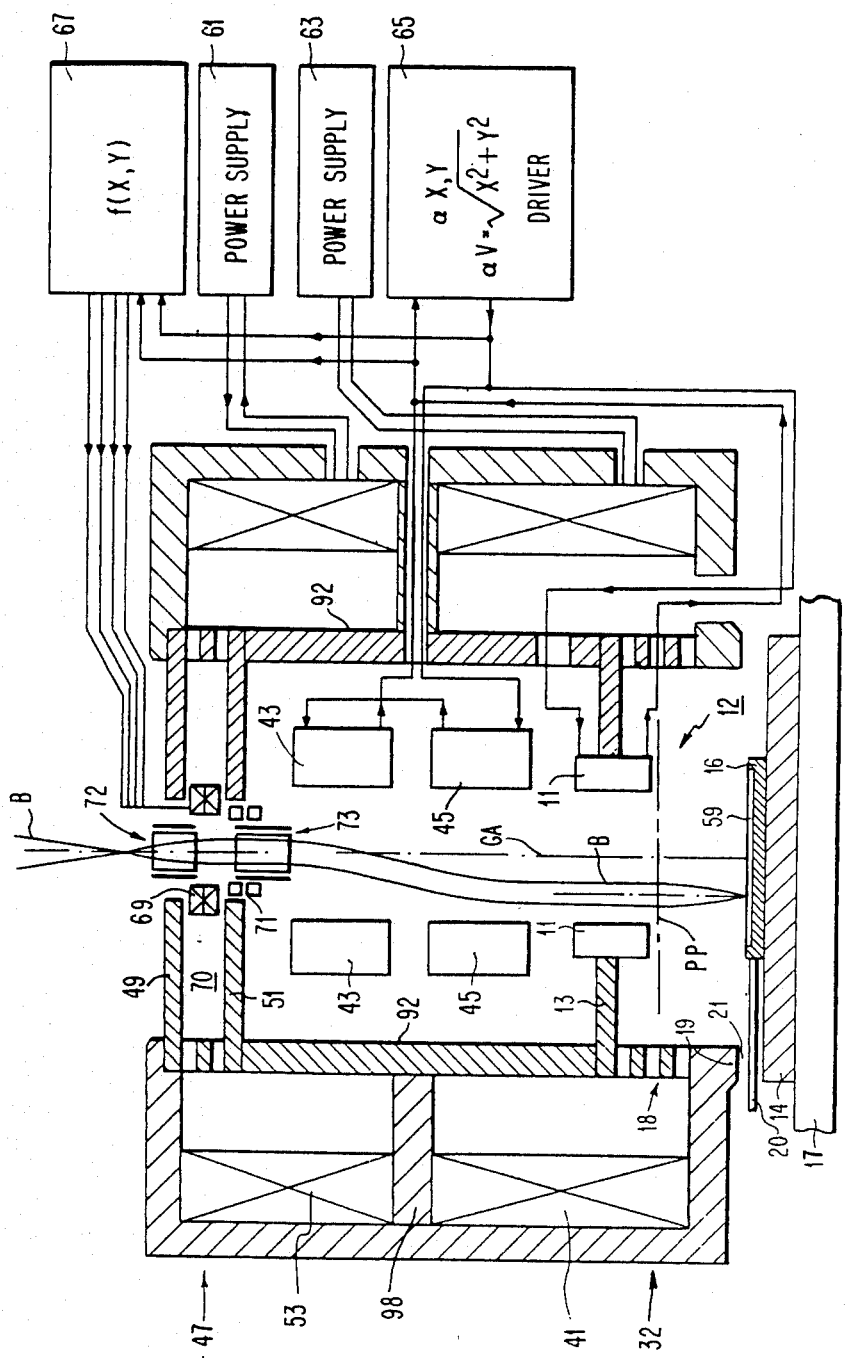
FIG. 1 is a schematic half-sectional drawing illustrating a system in accordance with this invention incorporating the Variable Axis Immersion Lens.

Referring to FIG. 1, a schematic half-sectional drawing illustrates an electron beam projection system in accordance with this invention which incorporates the Variable-Axis-Immersion-Lens (VAIL) system of U.S. Pat. No. 4,544,846, of Langner et al (the disclosure of which is incorporated herein by reference.)

At the top of the projection system in FIG. 1, the system includes a magnetic collimating lens 47 with non-zero bore annular pole pieces 49 and 51, and an excitation coil 53 for the collimating lens 47 which collimate the beam B to provide telecentric capability.

Upper Deflection Stage

Within the opening in annular pole piece 49 is the upper beam deflection stage comprising a set of X, Y multipole electrostatic deflection plates 72, preferably dodecapole (12 plates per set) multipole deflectors. Within and below the opening in annular pole piece 51 is a second set of X, Y multipole electrostatic deflection plates 73, preferably dodecapole (12 plates per set) multipole deflectors. The deflection plates 72 and 73 can be located elsewhere, but must precede the lower deflection stage, i.e. main deflection yokes 43 and 45, which provide the main magnetic field for controlling deflection of beam B.

Lower Deflection Stage

The lower deflection stage comprises a pair of main deflection yokes 43 and 45 predeflect the projected electron beam B to the left as illustrated, as an example, in FIG. 1. The upper deflection yoke 43 and the lower deflection yoke 45 are both preferably toroidal magnets. Stigmators 71 which are located below the collimating lens 47, provide astigmatism correction of the electron beam B while the dynamic focus coil 69 is located in the pole pieces of the collimating lens 47.

Projection Lens

Projection lens 32 includes an upper magnetic path comprising non-zero bore, upper pole piece 13 and a lower magnetic path formed of a return path section 19 and a lower pole piece, i.e. zero bore section 14. One plane of the projection lens 32 is the principal plane PP which is the principal plane on the object side of the lens 32, with the upper pole piece 13 above it and the lower pole piece 14 below it. Projection lens 32 is a thick lens, so it also has a principal plane on the image side of the projection lens 32, which is not illustrated in FIG. 2, since it is not of especial significance in terms of the invention herein. Excitation coil 41 activates projection lens 32 and produces magnetic field lines which run from upper pole piece 13 to lower pole piece elements 14 via return path 19. The VAIL system includes a VAIL assembly 12 which comprises the combination of the projection lens 32 and the magnetic compensation yoke 11. Shielding leg 18 includes alternating magnetic and nonmagnetic sections so that the magnetic lines of force from yoke 11 are isolated from penetration of windings 41. Also shielding leg 18 reduces the amount of magnetic field which is shorted away from the center of the lens. The magnetic circuit of the projection lens 32 is shaped at section 19 and the lower pole piece 14 to permit flux to pass to zero bore section 14 with a minimal amount of reluctance and fringing. The single magnetic compensation yoke 11 provides a magnetic field which is proportional to the first derivative of the axial magnetic field produced by the projection lens 32.

FIG. 1 also illustrates the target holding, handling and stepping means. Target 59 is mounted on a target holder 16 for providing accurate registration of the target within the electron beam projection system. A target handler arm 20 inserts the target 59 into VAIL assembly 12 via opening 21 therein. A target stepper table 17 is employed for X-Y movement of the target 59.

In the system of FIG. 1, astigmatism and field curvature are corrected using dynamic correction. The block 61 is a power supply for excitation coil 53. Block 63 is a power supply for excitation coil 41. Driver 65 represents a computer controlled driver for excitation of deflection yokes 43 and 45. Deflection yokes 43 and 45 have two sets of magnetic deflection coils which cooperate to deflect the electron beam B in both the X and Y directions in accordance with the usual practice. Deflection yokes 43 and 45 are typically comprised of a plurality of toroidal coils. Driver 65 also activates magnetic compensation yoke 11 which consists of a pair of X-Y magnetic deflection yokes. Magnetic compensation yoke 11 may comprise a simple saddle coil because of its smaller outer diameter for the same inner diameter as compared to a toroidal yoke of the same deflection sensitivity. The X-Y current sent to magnetic compensation yoke 11 is proportional to the X-Y currents sent to deflection yokes 43 and 45 and may be supplied by the same driver 65.

In the first approximation, the field of the compensation yoke 11 compensates the radial component of the magnetic field produced by the projection lens 32 along a line MA parallel to the geometrical (symmetry) axis GA of lens 32, but displaced laterally from the geometrical axis GA. Magnetic axis line MA defines the shifted electron optical axis, because the radial field component resulting from the superposition of fields of the compensation yoke 11 and the projection lens 32 is zero there. The position of the shifted electron optical axis MA is scanned synchronously with the current in the compensation yoke 11 and the main deflection yokes 43 and 45. The displacement of the optical axis MA from the symmetry axis GA of lens 12 is proportional to the current in the compensation yoke 11 and the deflection yokes 43 and 45.

In a case in which no sub-field deflection signal is applied to the electrostatic deflection plates 72 and 73, i.e., when the voltages on plates 72 and 73 are set to zero, the position of the beam B in the immersion lens 12 coincides precisely with the shifted electron optical axis MA. In addition the beam B enters the immersion lens assembly 12 as a parallel, collimated bundle of rays, representing an object at infinity. Two conditions of the beam B which result in the total elimination of blurring effects due to electrons of differing energies in the beam being deflected by differing amounts are as follows:

(1) The beam axis coincides with the shifted electron optical axis MA, (The beam axis is the central ray of the beam B from the top to the bottom of the beam B); and
(2) The object is at infinity.

This blurring is referred to in the literature as transverse chromatic aberration. Since transverse chromatic aberration is the leading limitation on the performance of more conventional deflectors, the elimination of this aberration is considered to be of fundamental importance.

In a case in which sub-field deflection is applied to plates 72 and 73, i.e., where the voltages on plates 72 and 73 are non-zero, the position of the beam B in the immersion lens assembly 12 deviates slightly from the ideal condition described above. Because the sub-field deflection& may be viewed as a small perturbation on the main-field deflection, this deviation from the ideal condition has negligible effect, and contributes negligible aberration and blurring.

As explained at Col. 7 lines 54–68 of U.S. Pat. No. 4,544,846, dynamic, astigmatic correction coil assembly 71 and dynamic focus coil 69 compensate for astigmatism, and curvature of field respectively. The dynamic correction coil assembly is preferably a dual quadrupole element drive by the driver 67. Driver 67 receives an input signal proportional to the currents which are sent to the X and Y main deflection yokes 43 and 45 and it generates a signal, by means of techniques well known to those skilled in the art.

Figure 2:
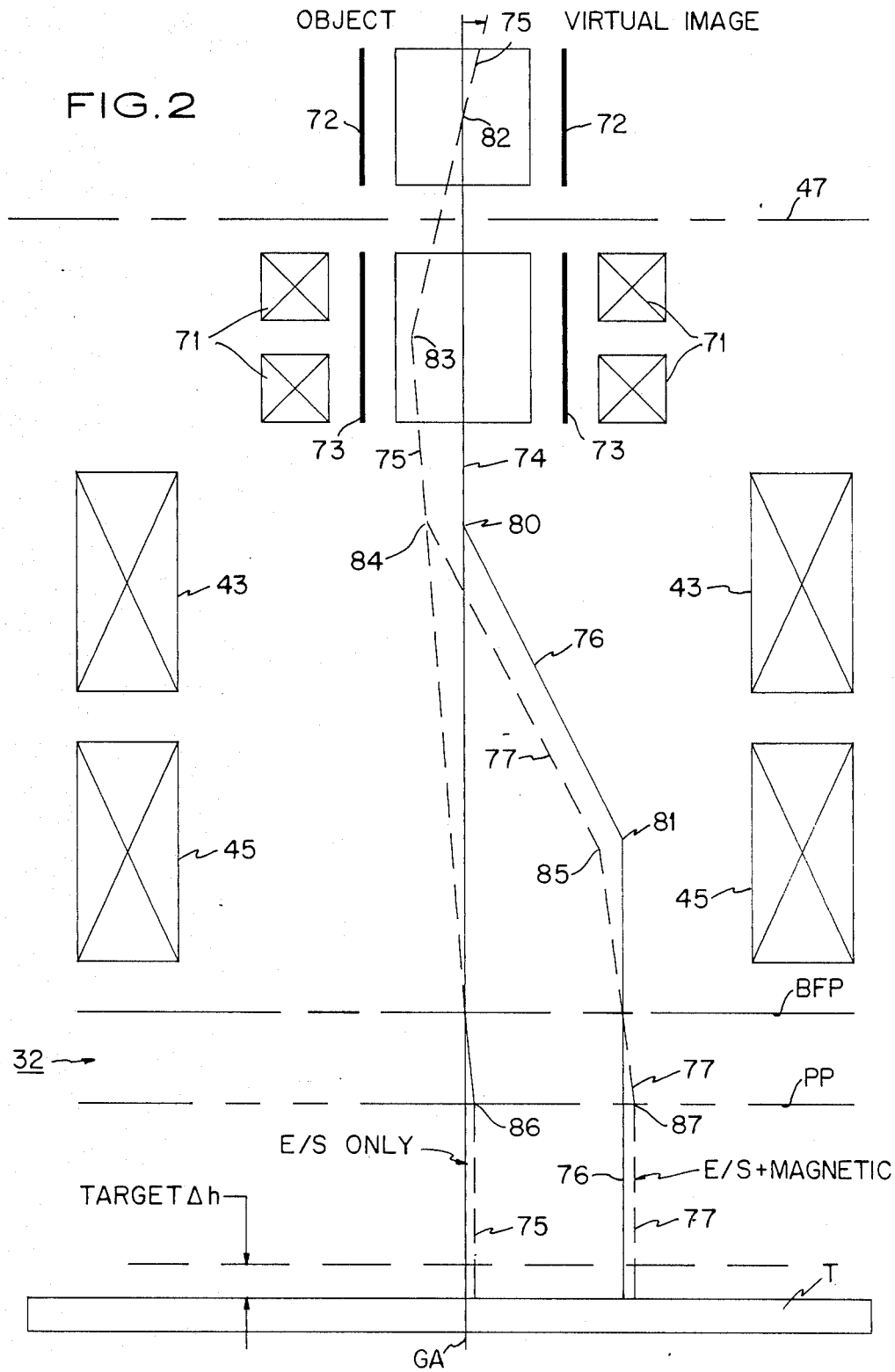
FIG. 2 is a schematic drawing of the deflectors and yokes of FIG. 1 with the deflecting axes produced illustrated relative to the geometrical axis of the system.

In order to maintain normal landing (telecentricity) for electrostatic sub-field deflection, the system must provide for beam B to cross a plane containing at any given time a rocking point which must be positioned to be located in the Back Focal Plane BFP of the VAIL lens assembly 12 shown in FIG. 2. The BFP is comprised of the various back focal points on the object side of the projection lens 32 which are all located in the same plane, i.e. the back focal plane BFP. Since the rocking point at the BFP is shifting laterally with the optical axis of a VAIL system, or any other equivalent off axis deflection system employed in accordance with this invention, it is not directly accessible to the electrostatic deflection elements such as 72 and 73. This is so because the electrostatic deflection elements such deflection yoke openings in toroidal yokes 43 and 45, since the beam B is scanned too far off from the geometrical center GA and produces severe deflection aberrations. However, double electrostatic deflection stages 72 and 73 (which are placed before the magnetic yokes of the variable axis deflection lens system in accordance with this invention as shown in FIG. 1) can rock the beam B at the back focal plane BFP maintaining the beam telecentric, so it lands on the workpiece or target T at a normal, i.e. vertical angle. Note that the second electrostatic deflector 73 must compensate for the refraction of the collimating lens 70, shown in FIG. 1.

A point source of rays emanating from the back focal point will come out of the projection lens 32 as a parallel bundle. This is the definition of back focal plane BFP. Similarly, any ray which intersects the lens axis MA at the back focal point will emerge from the projection lens parallel to MA, but in general displaced from MA. By "rocking" the beam about the back focal point we generate a cone of rays emanating from this point. These rays all emerge from the projection lens parallel to the axis MA, but displaced.

The phrase "emerge from the projection lens" 32, is equivalent to impacting the target writing surface 59. It is a key aspect of this invention that the rays impact the writing surface 59 at normal incidence; i.e., parallel to the axis MA. Only in this condition is the placement of the beam on the target 59, avoiding the errors in height deviation which are indicated by delta This is of great benefit, because the local height of the target is difficult to control. The wafer is typically tilted, out of flat, etc.

The "back focal plane" BFP is that plane which contains the back focal point for all paths of the beam B, and the BFP is perpendicular to the axes MA and GA. The planes containing the rocking points and the back focal plane BFP must coincide in position (i.e. be superimposed) so that the condition of telecentricity can be achieved. To get the rocking point to coincide with the back focal point, we adjust the ratio of the electrical strengths of the upper and lower dodecapoles. This moves the rocking point up and down along the axis MA. We know when the two points coincide when the beam impacts the target at normal incidence. In practice this is verified by scanning the beam over two separate test targets which are at different heights. The system is run as a scanning electron microscope (SEM) in this setup. The beam impacts the target at normal incidence when the SEM magnification is the same for the two targets. This is the same as saying that the beam landing position is totally insensitive to target height.

The double deflection electrostatic stages also minimize the off axis displacement in the projection lens 32, (relative to the geometrical axis GA) thereby eliminating deflection non-linearity resulting from spherical aberration. For a given point on the target 59, the magnetic deflection is illustrated by the solid line 76 in FIG. 2. The path of beam B labelled "E/S only" is traversed under the control of the electrostatic deflection plates 72 and 73, and it is shown by dotted line 75, which starting at the top of FIG. 2 bends to the left at point 82 in response to upper plates 72, bends to the right at point 83 in response to lower plates 73, and bends to a vertical alignment with target 59 at point 86 in response to the projection lens 32. The path of beam B in response to the magnetic deflection alone is shown in FIG. 2 by solid line 76, which bends down to the right at point 80 in response to the upper magnetic deflection yoke 43 and bends to a vertical downward alignment at point 81 in response to the lower deflection yoke 45. When the E/S deflection line 75 and the magnetic line 76 are superimposed the result in FIG. 2 is the combined dotted line 77, which bends at points 84, 85 and 87, analogously to points 80, 81, and 86 respectively, as described above. Since both the beam B and the optical axis MA are shifted in parallel and in coincidence, the double deflection electrostatic design is not affected.

Alternative Designs

Figure 3:
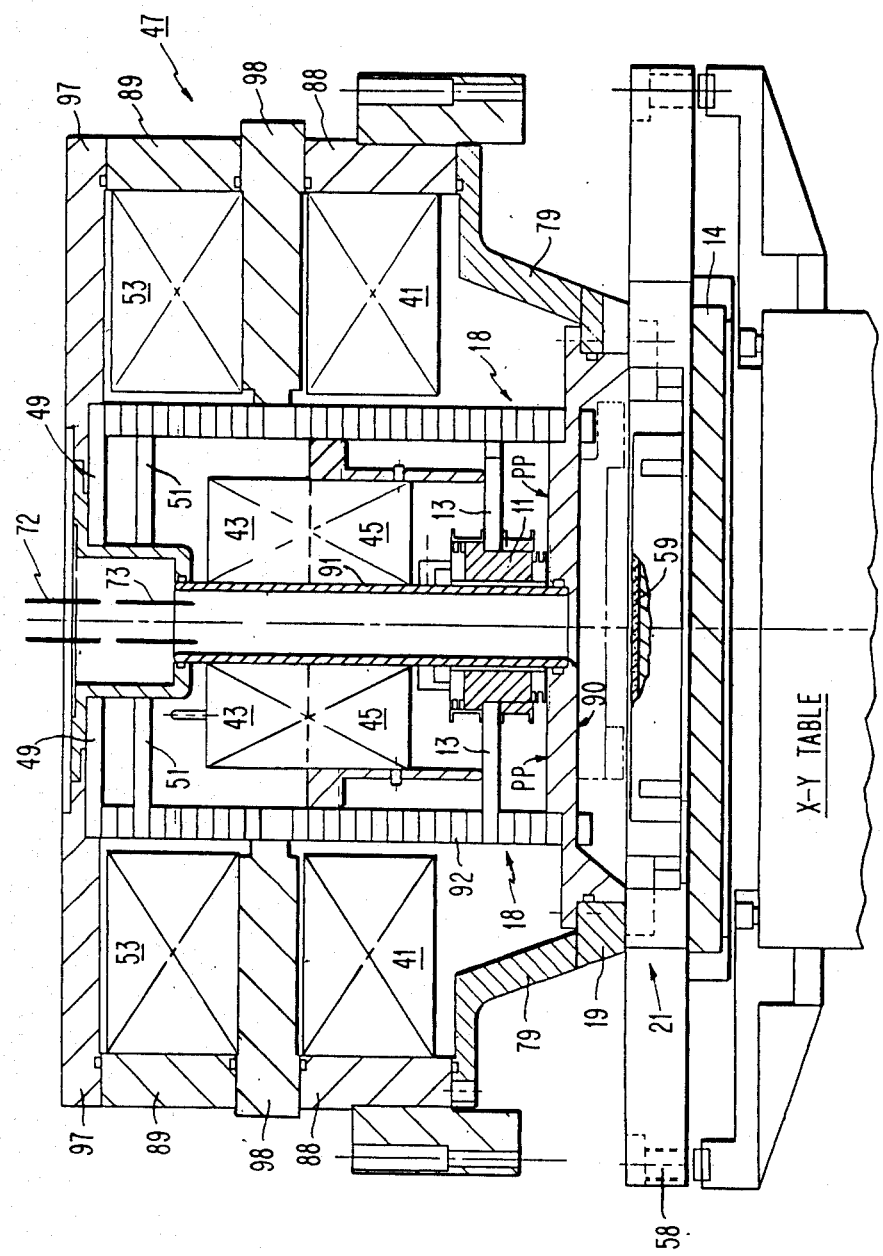
FIG. 3 shows a more detailed sectional view of the structure of FIG. 1.

FIG. 3 shows a specific embodiment of the system of FIGS. 1 and 2 wherein like parts have like numbers. A non-magnetic plastic mechanical support 90 carries a tubular cylinder 91 which provides the vacuum column for the electron beam which is generally directed along the center line of the cylinder 91, which is also nonmagnetic, but has a thin electrically conductive surface coating on its interior surface to prevent charging with a build-up of electrons. Support 58, which rests on the x-y table, supports the target 59. The zero bore section 14 composed of ferrite material (which is the lower pole piece, as explained above) is non-moving and secured to the vacuum chamber structure which holds the VAIL assembly. Magnetic hub 79 is carried by magnetic cylinder 88 above support 58, so support 58 is free to move beneath it. Magnetic cylinder 88 also carries coil 41. Lower annular magnetic disk 98 rests on top of cylinder 88 and carries upper magnetic cylinder 89 and coil 53 on top of it. Completing the magnetic circuit is upper annular magnetic disk 97. Magnetic ferrite stack 92 provides support for pole piece 13 and pole piece 51, as well as completing magnetic circuits between the disk 98, cylinder 89 and magnetic pole pieces 13, and 51. Note that the stack 92 does not connect pole pieces 49 and 51 magnetically, nor does the magnetic path continue below the pole piece 13 (at leg 18.) All of the dynamically changing elements including the deflection coils 43, 45, correction yoke 11, and dynamic focus 69 and stigmator coils 71 are located in an eddy current free environment surrounded by a ferrite shield. The shield consists of stack 92, pole pieces 49, 51, 13 and 14 and shielding leg 18.

Industrial Applicability

This invention is applicable in the manufacture of chips for data processing such as personal computers, minicomputers, large scale computers and other data processing equipment.

We claim:

1. A two stage, vail electron beam projection system including
   (a) a target,
   (b) a source of an electron beam and means for projecting said electron beam towards said target with the upper surface thereof defining a target plane,
   (c) a magnetic projection lens having a principal plane and a back focal plane located between said means for projecting and said target,
   (d) said means for projecting providing an electron beam directed towards said target,
   (e) lower stage means for providing deflection of said beam from area to area within a field,
   (f) upper stage means for providing deflection of said beam within a said area within a said field, said upper stage means being located above said lower stage means, said upper stage means deflecting said beam in a first direction away from the geometrical axis of said system, and then reflecting said beam in a second direction towards said geometrical axis of said system, said lower stage means deflecting said beam in one direction, and then in another, direction substantially normal to said target plane,
   (g) said beam crossing said back focal plane producing a telecentric condition of said beam in the image plane with said beam substantially normal to said target plane from said principal plane to said target plane,
   (h) said magnetic projection lens including a magnetic compensation structure positioned within said projection lens, whereby said projection system projects on said target plane from said projection system as deflected by said upper and lower stages, at all times maintaining the telecentric condition at said target plane throughout the entire range of deflection of said beam, assuring minimum errors due to target height variations.

2. A two stage, electron beam projection system in accordance with claim 1 wherein said magnetic compensation structure is substantially proportional to the first derivative of the axial magnetic projection field, with said axial magnetic projection field providing substantially a zero first derivative of said axial magnetic projection field in the vicinity of said target.

3. A two stage, electron beam projection system in accordance with claim 1 wherein said magnetic compensation structure includes a magnetic compensation yoke providing a field compensating for the radial component of the magnetic field of said projection lens.

4. A two stage, electron beam projection system including
   (a) a source of an electron beam and means for projecting said electron beam towards support means for holding a target with the upper surface thereof defining a target plane,
   (b) a magnetic projection lens having a principal plane and a back focal plane,
   (c) a plurality of magnetic beam shifting means for shifting the axis of said beam and the axis of said projection lens in synchronism, (d) lower stage means for providing deflection of said beam within a field, said lower stage means including first and second sets of deflection means, (e) said first set of deflection means deflecting said beam once in a first direction away from the geometrical axis of said system, said second set of deflection means then deflecting said beam back into a path towards the geometrical axis of said system, (f) upper stage means for providing deflection of said beam comprising third and fourth sets of deflection means for providing deflection of said beam to areas within said field, said upper stage means being located above said lower stage deflection means, (g) said third and fourth sets of deflection means being directed in the x and y directions of deflection for deflecting said beam once with said third set of deflection means, said fourth set of deflection means then deflecting said beam back into a path through a rocking point in said back focal plane and normal to said back focal plane of said projection lens, (h) said magnetic projection lens including a magnetic compensation structure positioned within the bore of said projection lens which is substantially proportional to the first derivative of the axial magnetic projection field, with said axial magnetic projection field providing substantially a zero first derivative of the magnetic projection field in the vicinity of said target, whereby said beam crosses said back focal plane of said projection lens producing a telecentric condition in the image plane with said beam substantially normal to said target plane from said principal plane to said target plane, whereby said projection system projects said spot on said target plane from said projection system as deflected by said upper and lower stages, at all times maintaining the telecentric condition at said target plane throughout the entire range of axis movement assuring minimum errors due to target height variations.

5. A two stage, electron beam projection system including (a) a source of an electron beam and means for projecting said electron beam, (b) a magnetic projection lens having a principal plane and a back focal plane, (c) a plurality of magnetic beam shifting means for shifting the axis of said beam and the axis of said projection lens in synchronism, (c) a collimating lens, (d) a target plane, (e) said electron beam being providing a spot directed at said target plane, (f) said projection system including means for scanning a field to be exposed by said beam, (g) lower stage means for providing deflection of said beam over a field in a discontinuous row-by-row scan of said field, (h) upper stage means for providing deflection of said beam comprising first and second sets of electrostatic deflection plates for providing vector deflection of said beam to a series of particular loci upon a target, said upper stage means being located above said lower stage deflection means, (i) said first and second sets of plates being directed in the x and y directions of deflection for deflecting said beam once with said first set of plates and said second set of plates then deflecting said beam back into a path intersecting the geometrical axis of said beam at a rocking point in said back focal plane of said final projection lens in the absence of a deflection by said lower stage means, at the back focal plane of said final projection lens producing a telecentric condition in the image plane with said beam substantially normal to said target plane, whereby said projection system projects said spot on said target plane from said projection system as deflected by said upper and lower stages, at all times maintaining the telecentric condition at said target plane throughout the entire range of axis movement assuring minimum errors due to target height variations.

6. A system in accordance with claim 5 wherein said lower stage deflection system comprises a magnetic deflection system for scanning said beam in a modified raster scan extending over a field on said target plane, with said modified raster scan proceeding from the center of one sub-field position to the next sub-field position, one-by-one, with said beam temporarily arresting its scan as it reaches the center of each current sub-field it reaches in said field to permit completion of operations of said electrostatic deflection system.

7. A system in accordance with claim 5 wherein said upper stage deflection system is proximate to said collimating lens.

* * * * *

UNITED STATES PATENT AND TRADEMARK OFFICE
CERTIFICATE OF CORRECTION

PATENT NO.   :   4,859,856
DATED        :   August 22, 1989
INVENTOR(S)  :   T.R. Groves, H.C. Pfeiffer, W. Stickel and M.A. Sturans It is certified that error appears in the above-identified patent and that said Letters Patent is hereby corrected as shown below:

In Claim 5, Line 26, after "means," insert new paragraph --(k) said beam crossing the electron optical axis-- then continue with "at the back focal plane..." to the end of Claim 5.

Signed and Sealed this

Seventeenth Day of December, 1991

Attest:

HARRY F. MANBECK, JR.

Attesting Officer

Commissioner of Patents and Trademarks